United States Patent
Uratsuji et al.

[11] Patent Number: 5,261,832
[45] Date of Patent: Nov. 16, 1993

[54] SOCKET FOR ELECTRIC PART

[75] Inventors: Kazumi Uratsuji, Tokyo; Noriyuki Matsuoka, Yokohama, both of Japan

[73] Assignee: Yamaichi Electric Co., Ltd., Tokyo, Japan

[21] Appl. No.: 946,146

[22] Filed: Sep. 17, 1992

Related U.S. Application Data

[63] Continuation of Ser. No. 713,839, Jun. 12, 1991.

[30] Foreign Application Priority Data

Jun. 15, 1990 [JP] Japan .................. 2-157118

[51] Int. Cl.⁵ .............................. H01R 11/22
[52] U.S. Cl. .................... 439/266; 439/269; 439/70
[58] Field of Search .............. 439/266–270, 439/263, 264, 68–73

[56] References Cited

U.S. PATENT DOCUMENTS

| | | | |
|---|---|---|---|
| 4,691,975 | 9/1987 | Fukunaga et al. | 439/266 |
| 4,715,823 | 12/1987 | Ezura et al. | 439/267 |
| 4,846,703 | 7/1989 | Matsuoka et al. | 439/264 |
| 4,846,704 | 7/1989 | Ikeya | 439/267 |
| 5,009,609 | 4/1991 | Matsuoka et al. | 439/264 |

Primary Examiner—Larry I. Schwartz
Assistant Examiner—Hien D. Vu
Attorney, Agent, or Firm—Wenderoth, Lind & Ponack

[57] ABSTRACT

A socket for an electric part has a socket body, and the socket body has a push-up spring for exerting an upward force to an electric part. A group of push-down contacts operated to be placed in pressure contact with a group of terminals of the electric part exert downward forces on the terminal. The downward forces of the push-down contacts are set to be larger than the upward force of the push-up spring. The push-down contacts, when placed in pressure contact with the terminals of the electric part, push down the terminals of the electric part while biasing the push-up spring and slidedly moving along the surfaces of the terminals of the electric part.

7 Claims, 4 Drawing Sheets

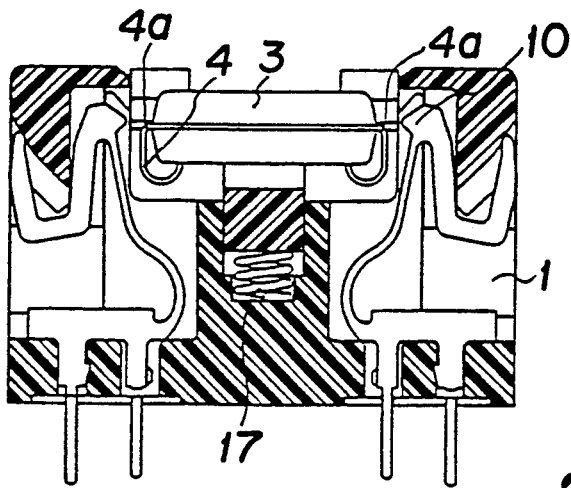
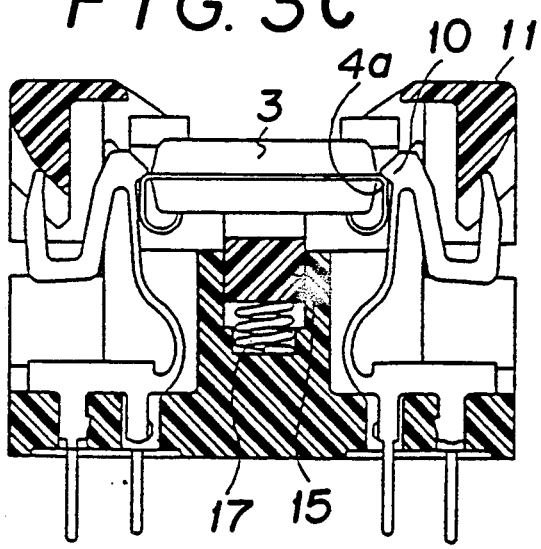
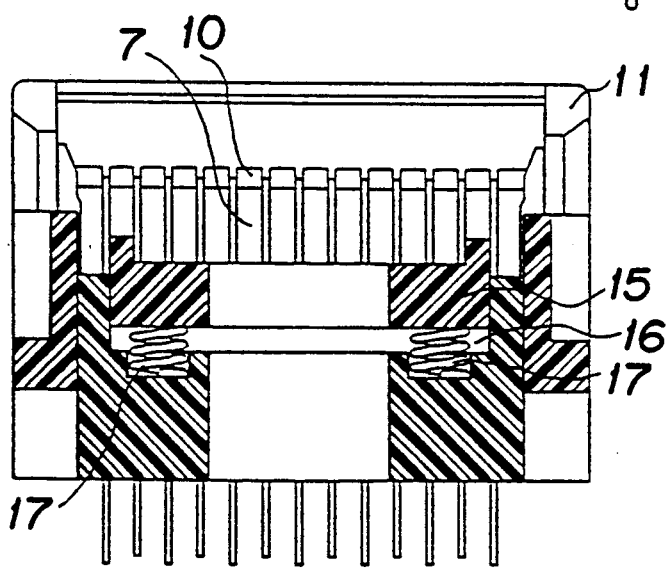

SOCKET FOR ELECTRIC PART

This application is a continuation of now abandoned application, Ser. No. 07/713,839, filed on Jun. 12, 1991.

BACKGROUND OF THE INVENTION

1. Field of the Invention

This invention relates to a socket for an electric part such as an IC, etc., and more particularly to a socket for an electric part in which a group of contacts provided on a socket body are operated to be in pressure contact with a downward force with a group of terminals provided on an electric part.

2. Brief Description of the Prior Art

An IC socket disclosed in U.S. Pat. No. 4,715,823, etc. includes a socket body and a contact shutter member mounted on an upper part of the socket body in such a manner as to be movable upward and downward. The contact shutter member, when pushed down, displaces the contacts backward against their elasticity to form a contact release state relative to the IC terminals so that an IC can be inserted and removed with no load in that state. The contacts, when the push-down force of the contact shutter member is released, are displaced forward due to the elasticity thereof to come into contact with the IC terminal in such a manner as to exert a downward force on a bent portion of each of the IC terminals while pushing up the contact shutter member.

In the above-mentioned socket, the contacts are displaced forward due to their elasticity and receive a contact pressure by being elastically pushed against the surface of the IC terminals, which are laterally held in a stationary state. The reliability of the contact relation between each of the corresponding IC terminals and contacts depends on only the elasticity of these contacts.

On the other hand, high density arrangements of IC terminals has progressed in recent years, and miniaturization of contacts is required now more than ever. If the contacts are miniaturized, however, the elastic coefficient inevitably becomes small, weakening their function against the IC terminals by lowering the contact pressure. As a result, a problem arises in that it is difficult to obtain a highly reliable contact relation only by means of the elasticity of the contacts.

Further, although it is desirable that the contact shutter member can be operated with as small a push-down force as possible, the reduction of the operating force in the conventional example also results in a reduction of the elastic force of individual contacts, thereby lowering the contact pressure. In other words, in the conventional example, it is difficult to reduce the push-down operating force of the contact shutter member while maintaining the contact pressure from the (elastic forces of the contacts).

The present invention has been accomplished in order to obviate the above-mentioned disadvantages inherent in the prior art.

SUMMARY OF THE INVENTION

It is therefore an object of the present invention to provide a socket for an electric part, in which a reliable contact-relation can be obtained while making it possible to miniaturize the contacts so that even if the push-down operating force of a contact shutter member is reduced by miniaturizing the contacts, (reducing the elastic forces), a reliable contact relation is not jeopardized.

As a means for achieving the above-mentioned object, the present invention is constructed such that a socket for an electric part comprises a socket body, the socket body including a push-up spring adapted to exert an upward force to an electric part, and a group of push-down contacts adapted to be in pressure contact with a group of terminals of the electric part to exert a downward force thereto. The downward forces of the push-down contacts are set to be larger than the upward force of the push-up spring. The push-down contacts, when in pressure contact with the terminals of the electric part, push down the terminals of the electric part while biasing the push-up spring and slidably moving along the surfaces of the terminals of the electric part.

With the above-mentioned construction of the present invention, the push-down contacts are contacted with the surfaces of the terminals of the electric part with a predetermined contact pressure. At the same time, the push-down contacts push down the terminals of the electric part while biasing the push-up spring with the downward forces thereof. In association with the push-down action, the push-down contacts slidably move along the surfaces of the terminals of the electric part. As a result, an oxide film on each of the contacted surfaces is removed to provide a clean electric contact relation at each active metallic surface.

Accordingly, a highly reliable contact relation can be obtained between each of the contacts and each of the terminals with a comparatively weak contact pressure. It follows that the contacts can be miniaturized in order to effectively coped with a high density arrangement of the terminals of the electric part. Furthermore, by miniaturizing the contacts, and thus reducing the elastic forces, the above-mentioned object of reducing the operating force of the contact shutter member can also be attained.

The above and other objects, characteristic features and advantages of the present invention will become more apparent to those skilled in the art from the following detailed description of a preferred embodiment, as illustrated in the accompanying drawings.

BRIEF DESCRIPTION OF THE DRAWINGS

The drawings show the preferred embodiments of the present invention, wherein:

FIG. 4(A) is a vertical sectional of view of FIG. 3(A);

FIG. 3(B) is a cross sectional view of a socket after the electric part is already inserted therein with no-load;

FIG. 3(C) is a cross sectional view of a socket in which the push-down contact is sliding along the terminal of the electric part to complete a contact relation therebetween after the push-down contact is brought into contact with the terminal of the electric part;

DETAILED DESCRIPTION OF THE EMBODIMENT

Figure 1A:
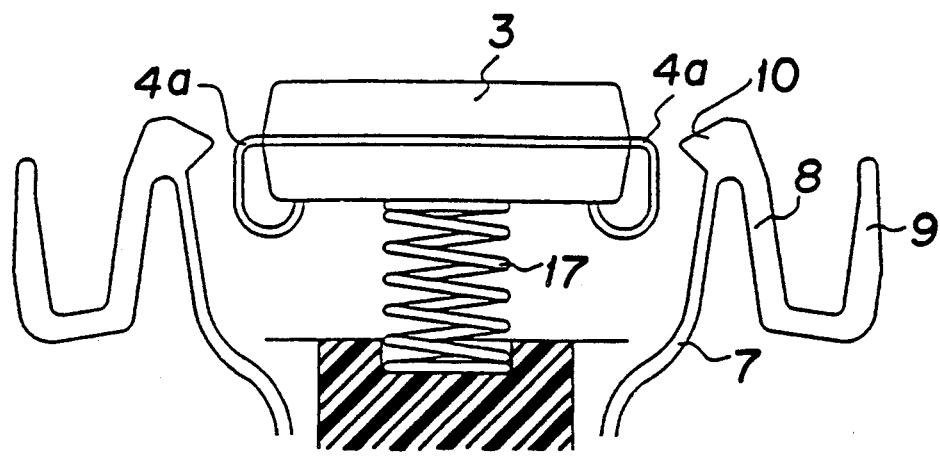
FIGS. 1(A), 1(B) and 1(C) are schematic front views for explaining the process of actions made by a push-down contact and a push-up spring against a terminal of an electric part, FIG. 1(A) illustrating a state before the push-down contact is brought into contact with the terminal of the electric part, FIG. 1(B) illustrating an initial stage of a contact relation between the push-down contact and the terminal of the electric part, and FIG. 1(C) illustrating a completed state of the contact relation.

The embodiment of the present invention will be described hereinafter with reference to FIGS. 1 through 4.

The numeral 1 denotes a rectangular socket body formed of an insulating material. The socket body 1 is provided with an electric part accommodating section 2 which opens up at an upper surface thereof. On two opposing sides, or four opposing sides, of the accommodating section 2, are arranged a group of contacts 5 adapted to be contacted with pressure with a group of terminals 4 of an electric part 3 so as to exert downward forces on the terminals 4.

The terminals 4 of the electric part 3 project outward from side surfaces of the electric part 3 and are each bent in a J-shape along the side surfaces. Each of the terminals 4 has an inverted L-shape bent portion 4a at a base portion of the projected portion. Each of the push-down contacts 5 is adopted to be in pressure contacted with the inverted L-shape bent portion 4a to exert the above-mentioned downward force thereto.

Each of the push-down contacts 5 has a male terminal 6 which projects downward from a lower surface of the socket body 1, a spring portion 7 extending upward from a base portion of each male terminal 6, a cantilever arm 8 extending backward from an upper end portion of the spring portion 7, a pressure bearing portion 9 rising upward from one end of the cantilever arm 8, and a contact nose portion 10 projecting from a connecting portion between the spring portion 7 and the cantilever arm 8. The contact nose portion 10 is adapted to exert a downward force on the corresponding terminal 4 of the electric part 3 accommodated in the accommodating section 2 when in pressure contact therewith, the contact nose portion 10 being disposed in such a manner as to face with the accommodating section 2.

On the other hand, a contact shutter member 11 movable upward and downward is disposed at an upper portion of the socket body 1. The contact shutter member 11 has an electric part load window 12 opposite the electric part accommodating section 2. A frame portion defining the load window 12 is provided with a cam portion 13 opposite the tip of the pressure bearing portion 9 of the push-down contact 5. The whole body of the contact shutter member 11 is supported by placing the cam portion 13 on the pressure bearing portion 9. The cam portion 13 has a first half surface gently inclined and a second half surface steeply inclined. The arrangement is such that a large displacement amount is obtained at the first, gently inclined half surface in which the push-down contact 5 is in an initial displacement stage and has a small elastic force, whereas a final displacement amount is obtained with a reduced force at the second, steeply inclined half surface, in which the contact 5 is in a find displacement stage and comes to have a large elastic force.

A mount table 15 adapted to support the electric part 3 is disposed at a central portion of an inner bottom of the electric part accommodating section 2 in such a manner as to be movable upward and downward. The upward and downward movements of the mount table 15 are guided by a guide 16 with which the mount table 15 is in engagement and which is formed in a bottom wall of the accommodating section 2. Further, the lower surface of the mount table 15 is resiliently supported by a push-up spring 17 for exerting an upward force on the electric part 3. The electric part 3 accommodated in the electric part accommodating section 2 is supported by the mount table 15. The arrangement is such that the electric part 3 is lowered together with the mount table 15 while compressing the push-up spring 17 and can be lifted upward by a restoring force of the spring 17. In the example of FIGS. 3 and 4, the electric part 3 is indirectly resiliently supported by the mount table 15 in order to exert an upward force to the electric part 3. Alternatively, the electric part 3 may be directly resiliently supported by the push-up spring 17 without the provision of the mount table 15, as in FIG. 1. A suitable example of the push-up spring 17 is a coil spring, as illustrated.

As described above, the contacts 5 form a means for pushing down the electric part terminals 4 and the electric part 3, while the spring 17 forms a push-up means for the electric part 3 and terminal 4. Both the contacts 5 and spring 17 exert reverse forces, i.e., upward and downward forces, on the electric part 3 and the terminals 4 of the electric part 3.

Figure 3A:
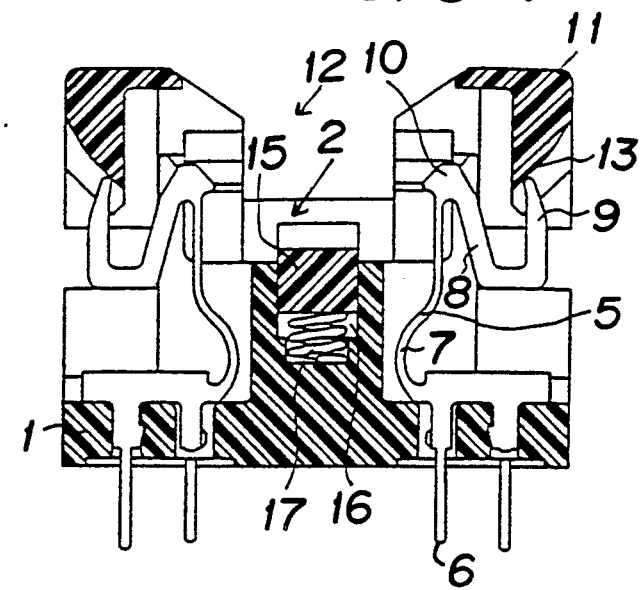
FIG. 3(A) is a cross sectional view of a socket before the electric part is inserted therein.
Figure 4B:
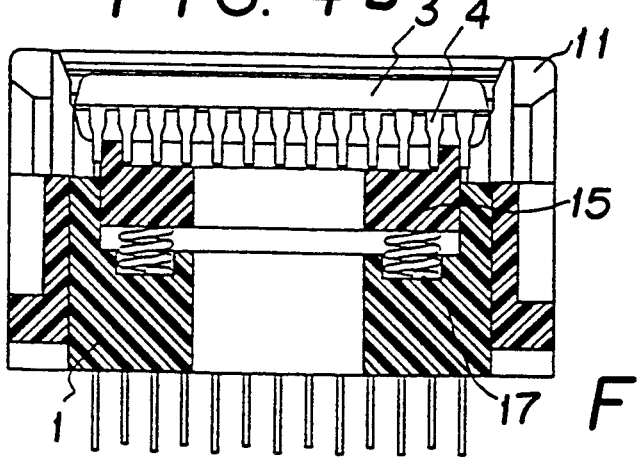
FIG. 4(B) is a vertical sectional view of FIG. 3(B)
Figure 4C:
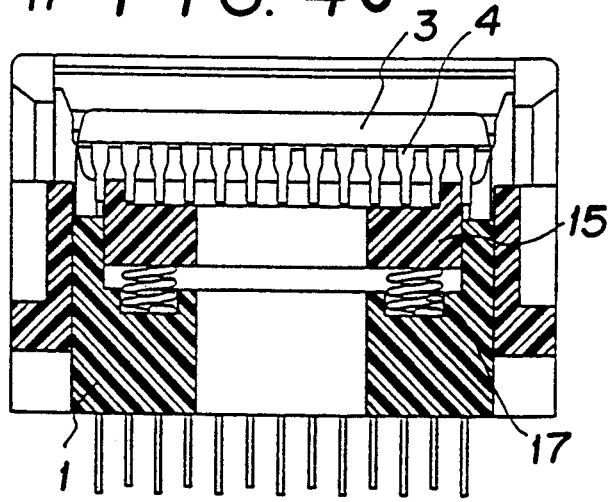
FIG. 4(C) is a vertical sectional view of FIG. 3(C)
Figure 5:
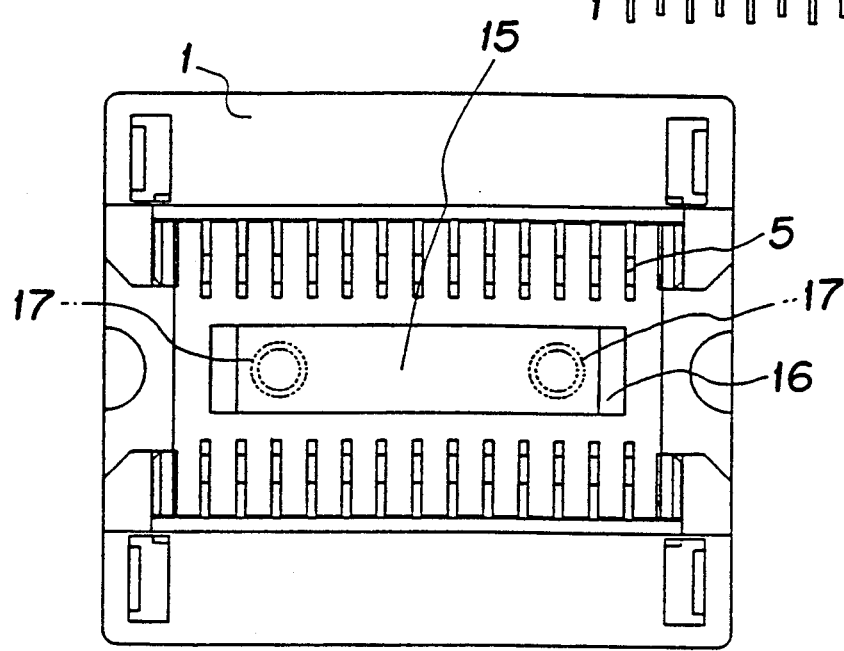
FIG. 5 is a plan view of a socket body.

As is shown in FIGS. 1(A), 3(A) and 4(A), the contact shutter member 11 is supported in an upper position by the pressure bearing portion 9 of each push-down contact 5. When the contact shutter member 11 supported in the upper position is pushed down by hand or a robot operation, the cam portion 13 is lowered while depressing the pressure bearing portion 9 of the contact 5 to bias the spring portion 7. The contact nose portion 10 is thereby backwardly displaced into a contact release position to release the accommodating section 2 (see FIGS. 1(B), 3(B) and 4(B)). In this state, the electric part 3, as represented by an IC, is inserted into the accommodating section 2 with no-load and is supported by the mount table 15 in the accommodating section 2.

Figure 1B:
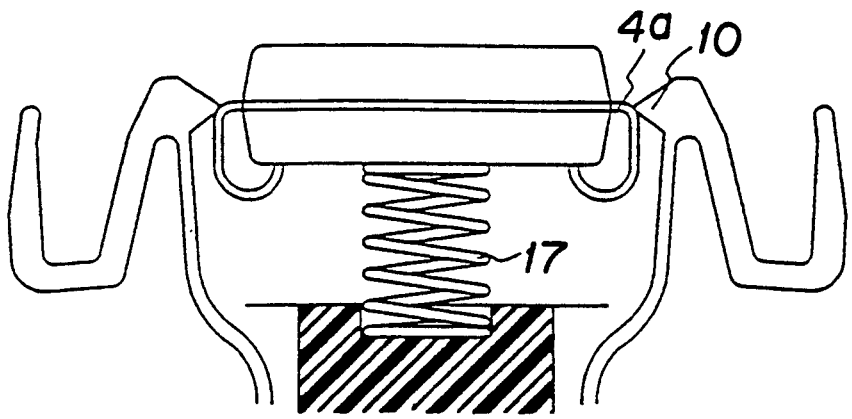
Figure 1C:
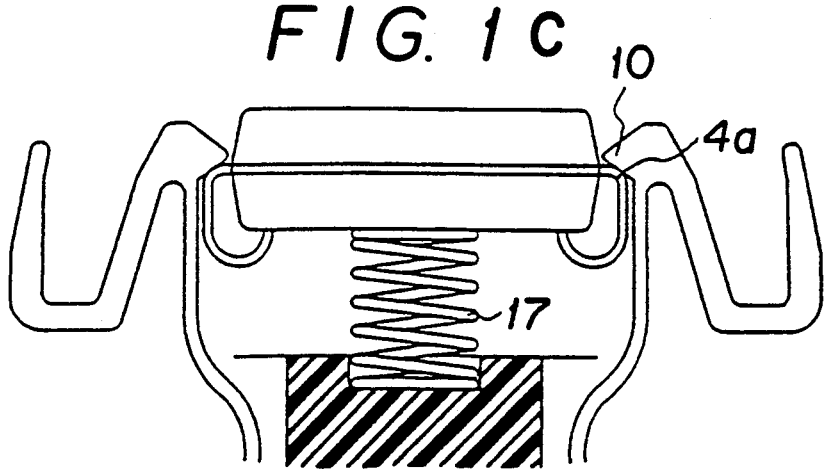
Figure 2:
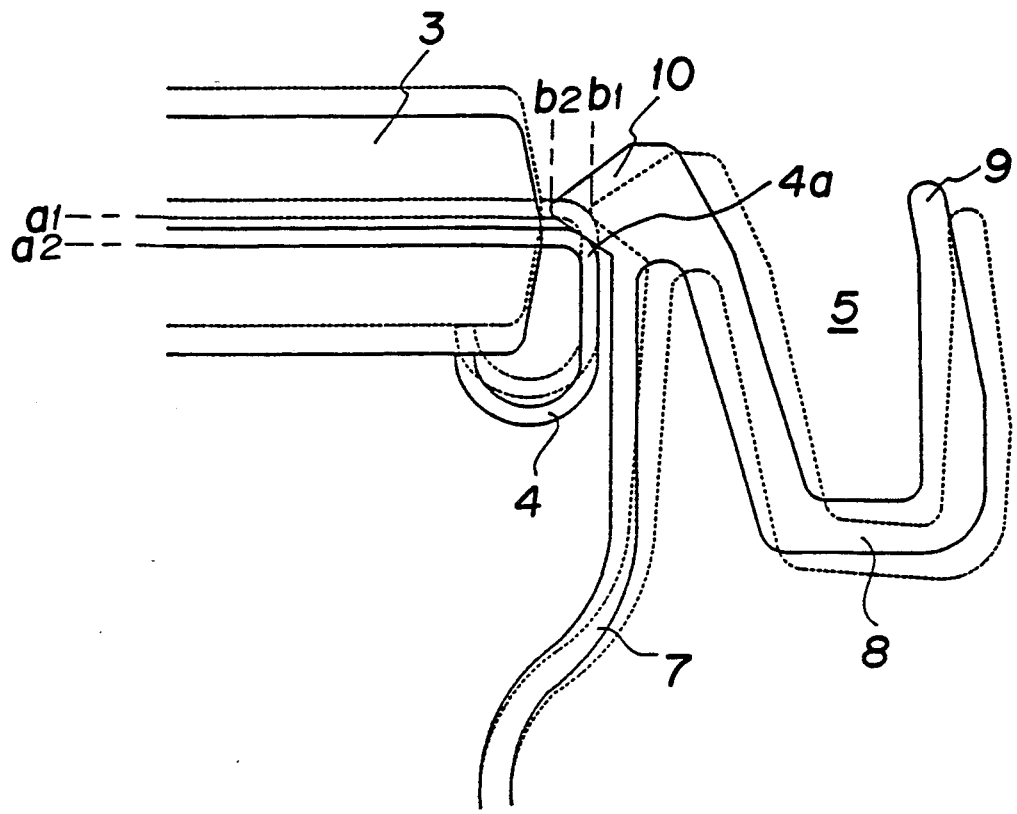
FIG. 2 is an enlarged sectional view showing an orbit of sliding movement between the push-down contact and the terminal of the electric part obtained in association with the push-down operation of the terminal of the electric part.

When the push-down force of the contact shutter member 11 is released after the electric part 3 has been inserted, the spring portion 7 is restored, and while the pressure bearing portion 9 pushes up the contact shutter member 11, the contact nose portion 10 is displaced forwardly so as to be placed in pressure contact with the surface of the reverse L-shape bent portion 4a of the electric part terminal 4 from the side (see FIGS. 1(B) and 2 at point $a_1$. Even after the contact nose portion is placed in pressure contact with the terminal 4, the spring portion 7 is continuous to be restored. As a result, the contact nose portion 10 exerts a larger downward force on the terminal 4 and electric part 3 than the upward force exerted by the push-up spring 17. As a consequence, while depressing the spring 17, the push-down contact 5 pushes down the electric part 3 and terminal 4 from a position indicated by $a_1$ to a position indicated by $a_2$ in FIG. 2. As a result, the contact nose portion 10 of the push-down contact 5, while maintaining the pressure contact relation with the terminal 4, is slidably moved from a position indicated by $b_1$ to a position indicated by $b_2$ in FIG. 2, namely, from an angular portion of the inverted L-shape bent portion 4a of the terminal 4 to the upper surface thereof, to remove any oxide film by frictional contact therebetween in order to expose an active metallic surface to attain a clear contact relation (see FIGS. 1(C), 3(C), and 4(C)). Since the contact nose portion 10 is engaged with the upper surface of the inverted L-shape bent portion of the terminal 4, the electric part 3 is held in the accommodating section 2, and the contact relation is thus maintained.

As described in the foregoing, by means of such a simple arrangement as a push-down means formed by a contact and a push-up means formed by a spring, the downward force exerted by the contact being set to be larger than the upward force exerted by the spring, a frictional sliding movement of a pressure contact portion can be obtained by contacting the contact with an electric part terminal with pressure. An active metallic surface is thus exposed on the contact surface, and a clean electric contact related can be expected. Accordingly, a highly reliable contact relation can be obtained even with a comparatively weak pressure contact. As a result, since the reliability of the contact relation can be maintained even if the contact is miniaturized, it can effectively cope with a high density arrangement of terminals of an electric part.

Furthermore, by miniaturizing the contact to reduce its elastic force, the operating power for pushing down the contact shutter member can also be reduced.

Although the present invention has been described with reference to a preferred embodiment, many modifications and alternations may be made within the spirit of the present invention.

What is claimed is:

1. A socket for an electric part, said socket comprising:
   a socket body for receiving the electric part;
   a plurality of resilient contacts mounted in said socket body for contacting terminals of the electric part, each said resilient contact having a contact nose portion; and
   means for receiving the electric part in said socket body at a predetermined position and for causing said contact nose portions of said resilient contacts to contact the terminals of the electric part at said predetermined position such that a downward force due only to the resiliency of said contacts is applied to the terminals of the electric part, said downward force being greater than an upward force on the electric part such that the terminals of the electric part are pushed and moved down by said contact nose portions applying said downward force and such that said contact nose portions slide on the terminals of the electric part while pushing and moving down the terminals, wherein said means includes a spring in said socket body applying said upward force on the electric part, said contact nose portions being positioned above said spring such that said predetermined position whereat said contact nose portions contact the terminals of the electric part is above said spring, and said spring being compressed under said downward force due only to the resiliency of said contacts.

2. The socket of claim 1, wherein said means further includes said contact nose portion on each said contact having a lower inclined surface.

3. The socket of claim 2, wherein each of the terminals of the electric part projects from a side surface of the electric part and is bent along the side surface of the electric part into an inverted 'L' shape at a base portion of the terminal, said lower inclined surface engaging and applying said downward force on a bend of the inverted 'L' shape of the terminal.

4. The socket of claim 1, wherein each of the terminals of the electric part projects from a side surface of the electric part and is bent along the side surface of the electric part into an inverted 'L' shape at a base portion of the terminal, each said contact nose portion engaging and applying said downward force on a bend of the inverted 'L' shape of the terminal.

5. The socket of claim 1, wherein:
   said socket body further has an electric part accommodating section with a central portion having a mount table therein for supporting the electric part thereon, said mount table being moveable upward and downward;
   a guide is formed in said electric part accommodating section engaged with and guiding said mount table for upward and downward movement;
   said mount table has a lower surface elastically supported by said spring; and
   said mount table receives the electric part thereon, supports the electric part at said predetermined position and is moved downward against said upward force of said spring together with the electric part.

6. The socket of claim 1, wherein said spring receives the electric part and supports the electric part at said predetermined position.

7. The socket of claim 1, wherein a contact shutter member is provided on said socket body and is supported by said contacts for moving said contacts backward against their resiliency when the electric part is received by said means and allowing said contacts to move forward due to their resiliency to contact the terminals of the electric part.

* * * * *